United States Patent [19]

Chawki et al.

[11] Patent Number: 5,404,242
[45] Date of Patent: Apr. 4, 1995

[54] PHOTORECEIVER FOR FREQUENCY-MODULATED OPTICAL SIGNALS

[75] Inventors: Mouhammad J. Chawki, Lammian, Lebanon; Loic Le Guiner, Loctudy; Daniel Dumay, Rambouillet, both of France

[73] Assignee: France Telcom, Etablissement Autonome de Droit Public, Paris, France

[21] Appl. No.: 37,593

[22] Filed: Mar. 26, 1993

[30] Foreign Application Priority Data

Apr. 2, 1992 [FR] France .................. 92 04005

[51] Int. Cl.[6] ........................... H04B 10/06
[52] U.S. Cl. ..................... 359/189; 359/192; 372/28; 372/49
[58] Field of Search ........... 359/189, 190, 192-193, 359/182, 154; 372/28, 38, 49

[56] References Cited

U.S. PATENT DOCUMENTS

| | | | |
|---|---|---|---|
| 4,730,327 | 3/1988 | Gordon | 372/49 |
| 4,861,136 | 8/1989 | Stone et al. | 359/127 |
| 5,027,435 | 6/1991 | Chraplyvy et al. | 359/173 |
| 5,063,567 | 11/1991 | Nakajima | 372/28 |

FOREIGN PATENT DOCUMENTS

| | | |
|---|---|---|
| 0550309 | 7/1993 | European Pat. Off. ...... 359/189 |
| 2652465 | 3/1991 | France . |
| 2229880 | 10/1990 | United Kingdom . |

OTHER PUBLICATIONS

"1-5 Gbit/s Transmission Systems Using FP Laser as FSK Discriminator/Photodetector", Chawki et al., Electronics Letters, vol. 28, No. 17, Aug. 13, 1992 pp. 1573-1574.
Chawki et al. "First Low Polarization Dependence Optical FSK Receiver Based on a Fabry-Perot Laser with a Near Square Active Waveguide Structure"Electronics letters, vol. 29, No. 9, Apr. 29, 1993. pp. 738-739.
Electronics Letters, vol. 27, No. 23, Nov. 7, 1991, pp. 2183-2185, P. Pottier et al., "1.5 Gbit/s Transmission System Using All Optical Wavelength Converter Based on Tunable Two-Electrode DFB Laser".

*Primary Examiner*—Richard E. Chilcot, Jr.
*Assistant Examiner*—Kinfe-Michael Negash
*Attorney, Agent, or Firm*—Oblon, Spivak, McClelland, Maier, & Neustadt

[57] ABSTRACT

A photoreceiver for frequency-modulated optical signals. The photoreceiver is formed of a semiconductor laser of the FABRY-PEROT type, wherein one of the faces thereof which receives a frequency modulated light beam is given an antireflection treatment. The voltage at the laser terminals is also tapped. Such a device finds particular application to optical telecommunication systems.

6 Claims, 3 Drawing Sheets

PHOTORECEIVER FOR FREQUENCY-MODULATED OPTICAL SIGNALS

TECHNICAL FIELD

The present invention relates to a photoreceiver for frequency-modulated optical signals. It is used in optical telecommunications.

PRIOR ART

Among the various types of modulation used for optical signals, a particularly important position is occupied by frequency shift keying (FSK). It consists of shifting the frequency of the optical signal emitted as a function of the information to be transmitted. This modulation can be easily obtained with a single-frequency semiconductor laser by modulating the polarizing current.

The detection of FSK-modulated optical signals generally takes place either by coherent detection, or by direct intensity modulation conversion, e.g. using a FABRY-PEROT etalon or air wedge. The first method requires a local oscillator (generally constituted by a wavelength-tunable, single-frequency laser), a fast photodetector, a signal mixer and complex electronic circuits. It is therefore difficult to put into practice. This also applies in the latter case, which requires a tracking circuit for tuning one of the resonant frequencies of the etalon to that of the signal to be demodulated.

The article by M.J. Chawki, R. Auffret and L. Berthou entitled "1.5 Gbits/s FSK Transmission System Using Two Electrode DFB Laser as a Tunable FSK Discriminator/Photodetector", published in Electronics Letters, 19.7.1990, Vol. 26, No. 15, pp. 1146–1147, describes a photoreceiver for FSK-modulated optical signals and which comprises a distributed feedback (DFB) laser with two electrodes. This laser is polarized just below the threshold. Means are provided for tapping the voltage variation appearing at the terminals of one of the two electrodes of the receiver laser. This voltage variation restores the information used for modulating the optical beam.

FR-A-2,652,465 describes another type of photoreceiver for frequency-modulated optical signals and which once again comprises a semiconductor laser, but which on this occasion is supplied above the laser threshold. Once again the voltage variation at the laser terminals is tapped. However, as the supply current is regulated to a value well above the threshold, the laser functions as an oscillator and has a natural frequency. Compared with the natural voltage tapped in the absence of an injected beam, the tapped voltage then has a variation, whose amplitude is proportional to the deviation between the frequency of the injected beam and the natural frequency of the laser and whose sign is that of the frequency variation. The frequency modulation of the injected light beam is consequently directly translated into an amplitude modulation of the voltage tapped at the laser terminals.

Although satisfactory in certain respects, these means suffer from the disadvantage of requiring a grating above the active layer.

DESCRIPTION OF THE INVENTION

The present invention aims at obviating this disadvantage. It therefore recommends, still for the reception of frequency-modulated signals, the use of a semiconductor laser, whose voltage variation is tapped at the terminals, but this laser does not have an etched grating and uses a FABRY-PEROT resonator. As stated, the use of a FABRY-PEROT etalon for demodulating a frequency-modulated beam is known per se, but previously the etalon used was passive. In the invention, the FABRY-PEROT resonator constitutes the resonator of a semiconductor laser and is consequently part of an active device. Naturally, FABRY-PEROT semiconductor lasers are also known, but as fixed frequency generators and not as frequency-modulated optical beam photoreceivers. Moreover, the invention provides for a modification of the conventional FABRY-PEROT laser, which consists of covering one of the faces with an anti-reflection coating. This treatment reduces the fineness of the peaks of the FABRY-PEROT laser and allows an operation on quasi-linear parts of the flanks of these peaks. This treatment naturally also increases the optical losses of the resonator, which must be electrically compensated by supplying the semi-conductor structure at well above the threshold. For example, the laser is supplied with power approximately three times above the threshold.

Specifically, the present invention relates to a photoreceiver for frequency-modulated optical signals, which comprises a semiconductor laser with its active layer, a polarizing current source supplying the laser above the threshold, optical means for injecting a frequency-modulated light beam into the active layer of the laser, means for tapping the voltage variation at the laser terminals, said photoreceiver being characterized in that the laser comprises a FABRY-PEROT resonator with a first face covered with an antireflecting coating and receiving the frequency-modulated light beam.

The second face can either be untreated, or covered with a reflecting coating. This coating can be in the form of one or more layers.

The term threshold current is here understood to mean the threshold current measured prior to the anti-reflection treatment.

DETAILED DESCRIPTION OF AN EMBODIMENT

Figure 1:
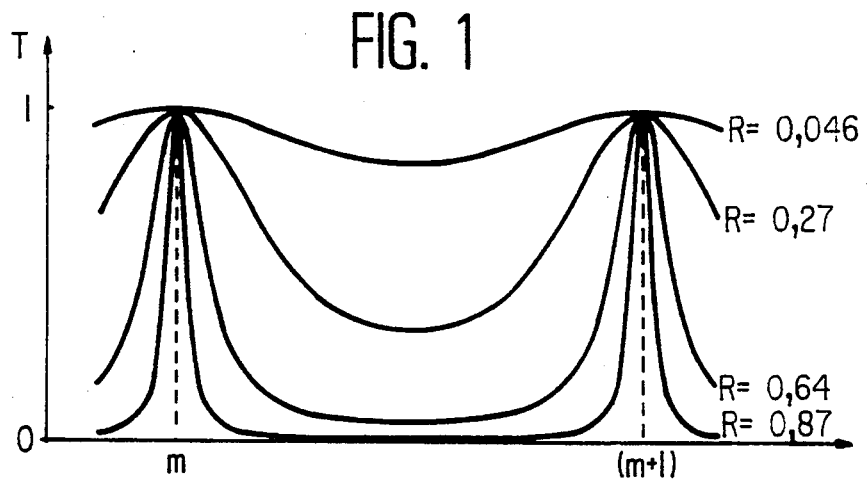
FIG. 1 shows the transmission factor of a FABRY-PEROT resonator as a function of the reflection coefficient.

FIG. 1 shows the transmission rate T of a FABRY-PEROT resonator as a function of the reflection coefficient R of its faces. This curve is periodic in frequency and defines different longitudinal modes m, m+1, etc.

The smaller the reflection coefficient the more overstretched the resonance. This coefficient is plotted on the various curves shown.

Figure 2:
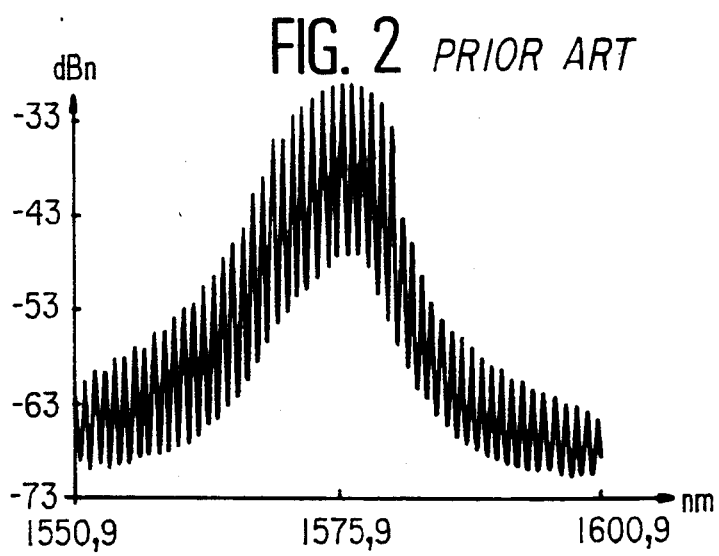
FIG. 2 shows the spectrum of a FABRY-PEROT semiconductor laser having reflecting faces.

FIG. 2 shows the spectrum of a semiconductor laser using a conventional FABRY-PEROT resonator. On the abscissa axis is plotted the wavelength (in this case 1550.9 to 1600.9 nm). On the ordinate appears the intensity in dBm (decibels related to 1 milliwatt).

Figure 3:
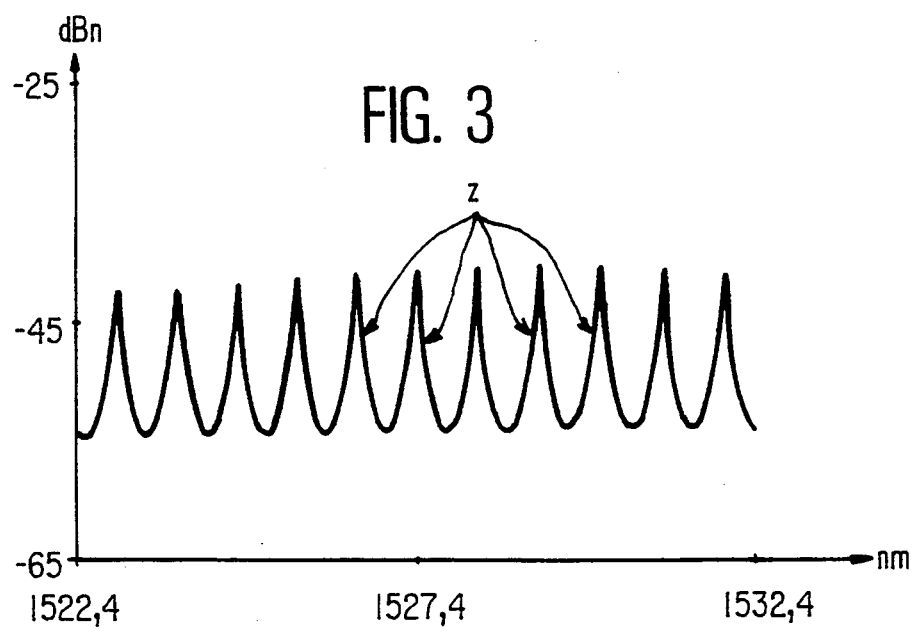
FIG. 3 shows the same spectrum, but with one face treated by an antireflecting layer.

FIG. 3 shows the spectrum of a laser used as a photoreceiver according to the invention. The input face of a FABRY-PEROT laser has been covered with an antireflection layer, which makes the reflection coefficient of this face drop to approximately $10^{-5}$ (instead of 33% for an untreated face). The frequency range is 1522.4 to 1532.4 nm. Any one of the zones marked Z located on the flank of the peaks can be used for carrying out the frequency demodulation.

Figure 4:
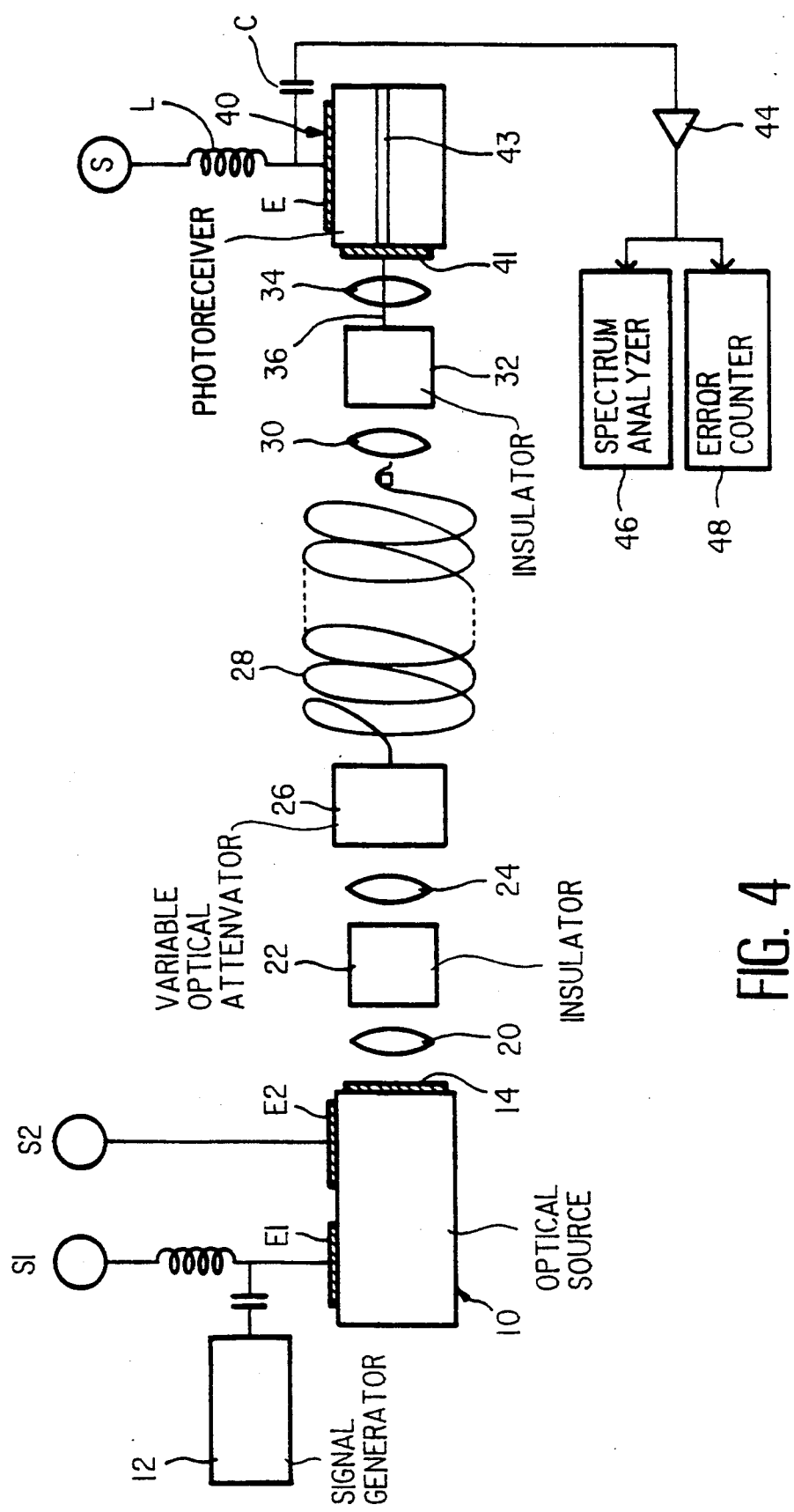
FIG. 4 illustrates an arrangement making it possible to test the photoreceiver according to the invention.

FIG. 4 shows a bench making it possible to test the photoreceiver according to the invention. This bench firstly comprises a wavelength-tunable, frequency-modulated, single-frequency optical source 10. This source can be a DFB laser, e.g. having a buried ridge stripe, whose supply electrode has been subdivided into two electrodes E1 and E2 connected to two power sources 10 S1 and S2. A signal generator 12 makes it possible to modulate the frequency of this laser. The length of the cavity can be 425 $\mu$m with one face 14 given a 2% antireflection treatment.

The bench also comprises optical means such as a microscope objective 20 for collimating the beam emitted by the laser 10, an insulator 22 (insulation of 38 dB at 1.52 $\mu$m), in order to eliminate the reflections which would disturb the operation of the laser 10, a second objective 24 for coupling the light into the core of a monomode fiber and a variable optical attenuator 26. These means make it possible to inject the frequency-modulated beam into an optical fiber 28.

On the reception side, there are once again various optical means such as a first microscope objective 30, an insulator 32, a second microscope objective 34 making it possible to inject the optical beam 36 into the active layer of the photo-receiver 40.

The photoreceiver 40 comprises a front face 41 treated with an antireflecting coating and a rear, reflecting face, an active layer 43, an electrode E connected to a polarization source S, means for tapping the voltage variation at the terminals of the electrode E. These means can be constituted by a polarizing T-coupler with a coupling capacitor C connected to an amplifier 44 (e.g. of 55 dB). The amplifier can supply a spectrum analyzer 46 and an error counter 48.

Figure 5:
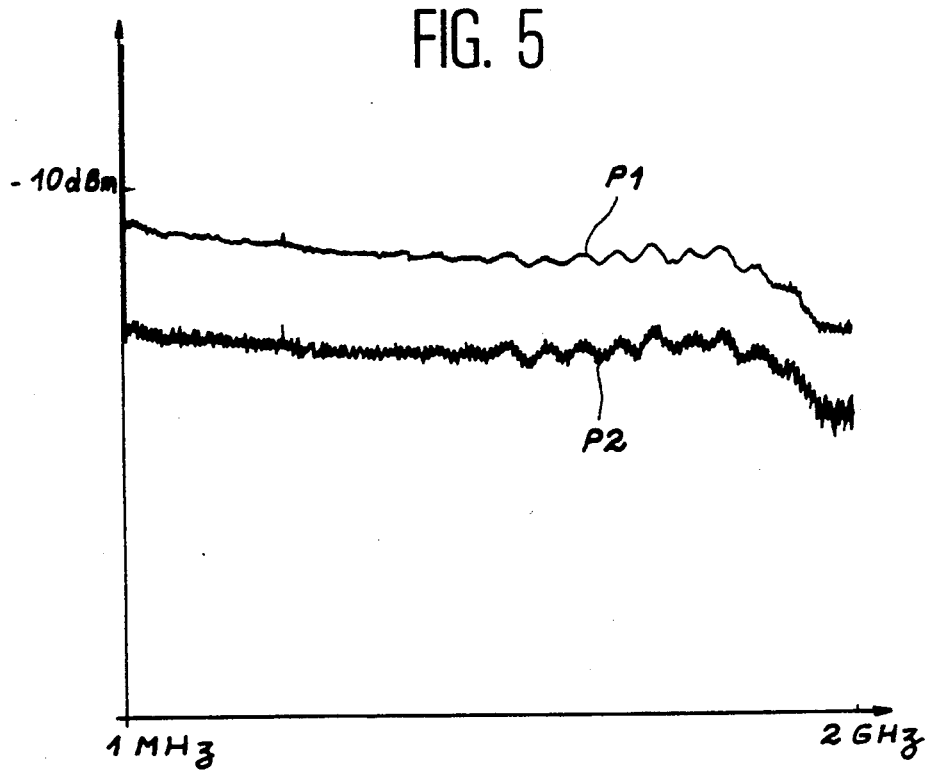
FIG. 5 shows the frequency response of the photoreceiver according to the invention.

FIG. 5 shows the measured frequency response of 1 MHz to 2 GHz with the bench for two injected optical powers, respectively $P_1 = -30$ dBm and $P_2 = -33$ dBm. The current modulation applied to the electrode of the DFB laser is equal to 4 mA peak-to-peak, so that there is a frequency excursion of 2 GHz. This frequency response curve has a relatively flat portion up to 2 GHz.

Figure 6:
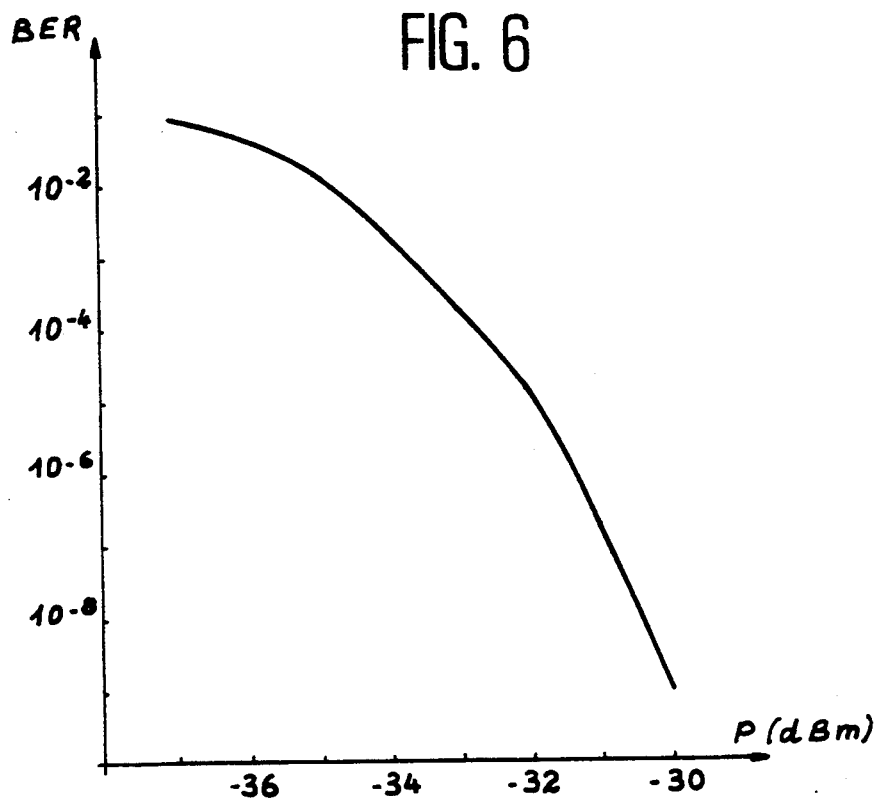
FIG. 6 shows the error rate as a function of the power received.

The limitation of the transmission rate was imposed by the frequency response of the emitting DFB laser. For a transmission of 1.5 GBit/s and a code ($2^{-15} - 15$) NRZ (non-return to zero), the error rate curve BER as a function of the power received P(dBm) is that of FIG. 6. An error rate of $10^{-9}$ is obtained for a system sensitivity of $-30$ dBm.

We claim:

1. A photoreceiver comprising:
   a semiconductor laser comprising a FABRY-PEROT resonator, an active layer and having a first face covered by an antireflecting coating;
   a current source supplying a current to the semiconductor laser through an electrode formed on the semiconductor laser;
   an optical system injecting a frequency modulated light beam into the active layer of the semiconductor laser through the antireflecting coating of the first face; and
   a tap tapping a voltage variation at the electrode formed on the semiconductor laser.

2. The photoreceiver according to claim 1, further comprising a reflecting coating provided on a second face of the semiconductor laser.

3. The photoreceiver according to claim 1, wherein the current source is a polarizing current source and the current supplied by the polarizing current source is approximately three times a threshold current of the semiconductor laser.

4. A photoreceiver comprising:
   a semiconductor laser comprising a FABRY-PEROT resonator, an active layer and having a first face covered by an antireflecting coating;
   a current source means for supplying a current to the semiconductor laser through an electrode formed on the semiconductor laser;
   an optical means injecting a frequency modulated light beam into the active layer of the semiconductor laser through the antireflecting coating of the first face; and
   a tap means for tapping a voltage variation at the electrode formed on the semiconductor laser.

5. The photoreceiver according to claim 4, further comprising a reflecting coating provided on a second face of the semiconductor laser.

6. The photoreceiver according to claim 4, wherein the current source is a polarizing current source and the current supplied by the polarizing current source is approximately three times a threshold current of the semiconductor laser.

* * * * *